(12) United States Patent
Whitesell

(10) Patent No.: US 6,929,699 B2
(45) Date of Patent: Aug. 16, 2005

(54) GAS INJECTORS FOR A VERTICAL FURNACE USED IN SEMICONDUCTOR PROCESSING

(75) Inventor: Christopher S. Whitesell, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 73 days.

(21) Appl. No.: 10/318,687

(22) Filed: Dec. 13, 2002

(65) Prior Publication Data

US 2004/0112288 A1 Jun. 17, 2004

(51) Int. Cl.[7] .............................................. C23C 16/00
(52) U.S. Cl. ....................................... 118/715; 118/724
(58) Field of Search ................................ 118/715, 728, 118/50

(56) References Cited

U.S. PATENT DOCUMENTS 5,478,397 A * 12/1995 Shibata et al. ............... 118/724
2003/0015138 A1 * 1/2003 Tometsuka ................... 118/715

* cited by examiner

Primary Examiner—Rudy Zervigon
(74) Attorney, Agent, or Firm—Jacqueline J. Garner; W. James Brady, III; Frederick J. Telecky, Jr.

(57) ABSTRACT

Improved long gas injectors for a vertical furnace used in semiconductor wafer processing are useful to minimize particulate contamination in the wafer processing area of the furnace, and minimize distortion of the long injectors during thermal excursions. The improved injectors are fabricated with a stabilizing quartz standoff positioned near the onset of the vertical portion of the injector tube which adds support to the long tube. Thickness of the standoff is calculated to define and enforce a specified separation distance between liner and injector, as well as to provide dual alignment points at the base of the liner and at the tip of the injector.

16 Claims, 3 Drawing Sheets

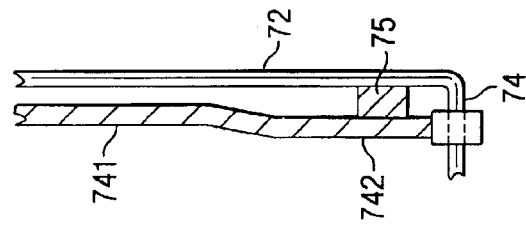
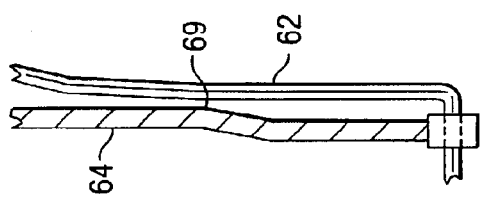
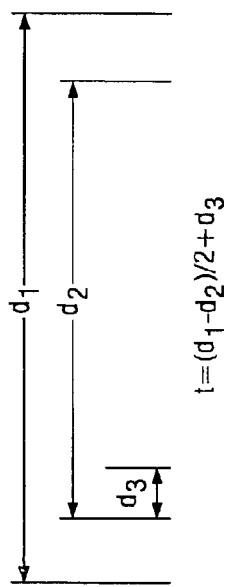
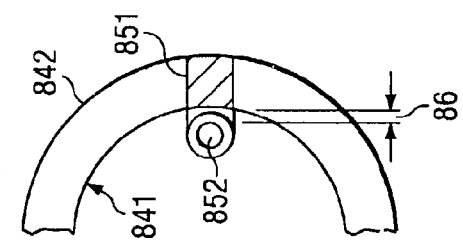
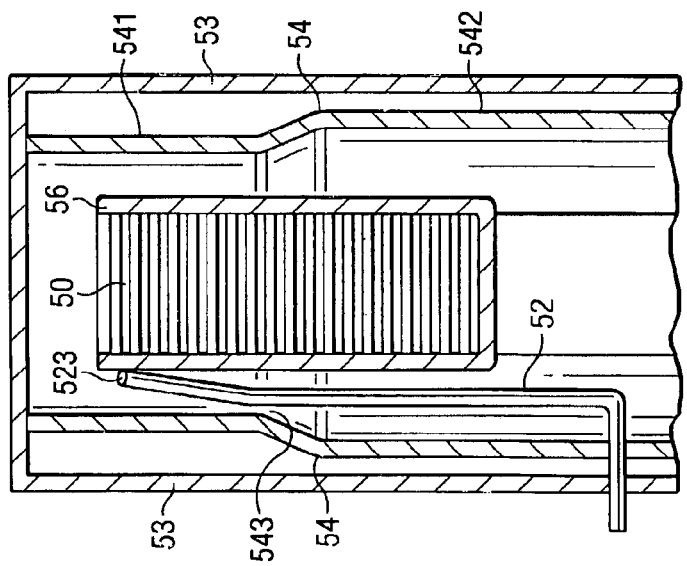

GAS INJECTORS FOR A VERTICAL FURNACE USED IN SEMICONDUCTOR PROCESSING

FIELD OF THE INVENTION

The present invention relates generally to semiconductor processing, and more specifically to gas injectors for a vertical furnace.

BACKGROUND OF THE INVENTION

In the fabrication of semiconductor devices, such as integrated circuits, numerous processing steps are carried out in a controlled atmosphere at elevated temperatures. Such processes include oxidation, diffusion, chemical vapor deposition, and annealing. In elevated temperature processing, semiconductor wafers are held in an evacuated chamber, typically a quartz tube housed within an electric furnace which exhibits excellent temperature stability and is equipped with precise temperature controllers. Processing gases are introduced and withdrawn from the chamber under controlled flow conditions.

In recent years, vertical furnaces have replaced horizontal furnaces because they present a number of advantages, including elimination of cantilever loading and insertion of quartz boats containing the increasingly massive semiconductor wafers, automated loading and unloading, and a smaller clean room footprint. As a result of the automated loading, and lack of contact between the furnace tube and the wafer boats, processing in a vertical furnace provides low particulate material generation, which enhances yield and reliability.

Increasingly more important in the fabrication of VLSI devices having multiple layers of dielectrics and conductors are chemical vapor deposition (CVD) processes. Thin films are CVD deposited on the upper surface of semiconductor wafers in a controlled environment at elevated temperatures. CVD processes involve introducing reactant gases into a reaction chamber, and then decomposing and reacting the gases at a heated surface of a semiconductor wafer to form a thin film. Typical films deposited by CVD include polysilicon, silicon dioxide, silicon nitride, and silicon oxynitride.

A variety of CVD techniques have been developed which optimize certain parameters, including uniformity of film thickness, lower particulate generation, and increased throughput. At the same time, furnaces and associated equipment manufacturers have made numerous improvements aimed primarily at the same objectives.

A schematic representation of a typical vertical furnace is shown in FIG. 1, a typical furnace tube in FIG. 2, and a typical wafer boat in FIG. 3. In FIG. 1, furnace 10 includes an external housing 11 having a control panel 12, a vertical tube 13, and loading and unloading ports 15 for boats of wafers. Not shown are the various heaters which surround the furnace tube, and the vacuum and gas supply systems.

In FIG. 2, it can be seen that a typical vertical furnace tube 23 houses an inner liner 24, a heat insulating mounting pedestal 27 for positioning the wafer boat 26, and ports 28, 29 for inlet and outlet of gases. Tubes referred to as gas injectors 22 are connected through inlet port 28 to disperse the reaction gases within the area between the liner and boat. Heating sources 25 surround the furnace tube. A boat 26, typically comprising quartz, placed vertically into the furnace supports a plurality of semiconductor wafers 30, placed horizontally, as shown in a side view in FIG. 3. The boat is essentially open in order to allow nearly unrestricted access of the gases to the wafers.

Referring again to FIGS. 2 and 3, the deposition process begins by positioning a plurality of semiconductor wafers 30 into boat 26, and placing the boat within the furnace on the pedestal 27. The interior of the vertical furnace is heated and the gases are vented through exhaust conduit 29. While the boat and pedestal rotate and are positioned in the specified thermal zone, the appropriate process gases are introduced through gas injectors 22. Inner line 24 contains the reactant gases in close proximity to the semiconductor wafers, and the liner diameter may change along the length of the tube in an attempt to provide the optimum gas flow to the wafers.

A typical gas injector 42, as shown in FIG. 4, is a quartz tube wherein the stem portion 44 enters the furnace tube horizontally as shown in FIG. 2 via port 28, and bends in a near 90 degree angle 41 to form a vertical portion 45 to be positioned between the liner and boat with wafers. The injector length, diameter, and gas exit tip 421 placement, as well as the liner design and material properties, are a function of the CVD process parameters. The combination of these design parameters is aimed primarily at deposition uniformity.

Gas injectors having short vertical rise generally remain well aligned, and present little concern for contact with the liner, wafers or boat. Thermal mismatch which could cause misalignment of the injectors is insignificant because of the short lengths. However, in practice a combination of tube lengths are employed with many deposition processes, and in particular, the tips of long tubes may become misaligned, come into contact with the tube or boat causing particulate generation, or in the worst case, may come into contact with the boat interfering with motion of the boat and wafers thereby causing great damage to both the furnace and the costly wafers.

Gas injectors vary in length from those having a short vertical rise to those of about 13 00mm length. With current injector design and placement, not only is there a danger that the tips can come into contact with the boat, but if the injector becomes misaligned or distorted, it may rub against the liner and contribute to particulate contamination.

Thus, there is a need throughout the industry for gas injectors in semiconductor processing furnaces which remain aligned through multiple thermal processing cycles, which present no probability of contact with either the wafer boat or furnace tube liners, and which avoid contribution to particulate contamination and ultimately to costly reliability and yield losses.

SUMMARY OF THE INVENTION

It is an object of the invention to provide a furnace tube having gas injectors which are stable during multiple thermal excursions, and which remain well aligned with respect to the liner and wafer boats.

It is an object of the invention to provide an injector having a specified separation distance from the liner.

It is an object of the invention to provide an improved design for long injectors which will avoid particulate generation as a result of contact with liner, boat, or wafers.

It is an object of the invention to ensure secure positioning of long injectors which will withstand the effect of multiple thermal excursions.

It is an object of the invention to provide a cost effective solution to the problem of long injector distortion.

It is further an objective of the invention to provide a stabilized gas injector which can be aligned to, and held at a specified distance from a multiple diameter liner.

The above and other objectives are met by providing an injector having a stabilizing standoff positioned near the onset of the vertical portion of a gas injector which adds support to the long tube. The standoff defines the separation distance between liner and injector, and allows dual alignment points at (1) the base of the liner and (2) at the tip of the injector.

The specific features and advantages of the invention will become apparent from the detailed description which proceeds with reference to the accompanying drawings.

BRIEF DESCRIPTION OF THE DRAWINGS

FIG. 5 illustrates a long injector which has become distorted and misaligned. (Prior art)

FIG. 6 illustrates in more detail the source of long injector distortion.

FIG. 7 is the injector or the current invention having a standoff to contact and provide alignment to the liner.

FIG. 8A is a top view of the injector tip and standoff, relative to a two diameter liner.

FIG. 8B provides a diagram and calculations for standoff thickness requirements.

DETAILED DESCRIPTION OF THE INVENTION

Figure 1:
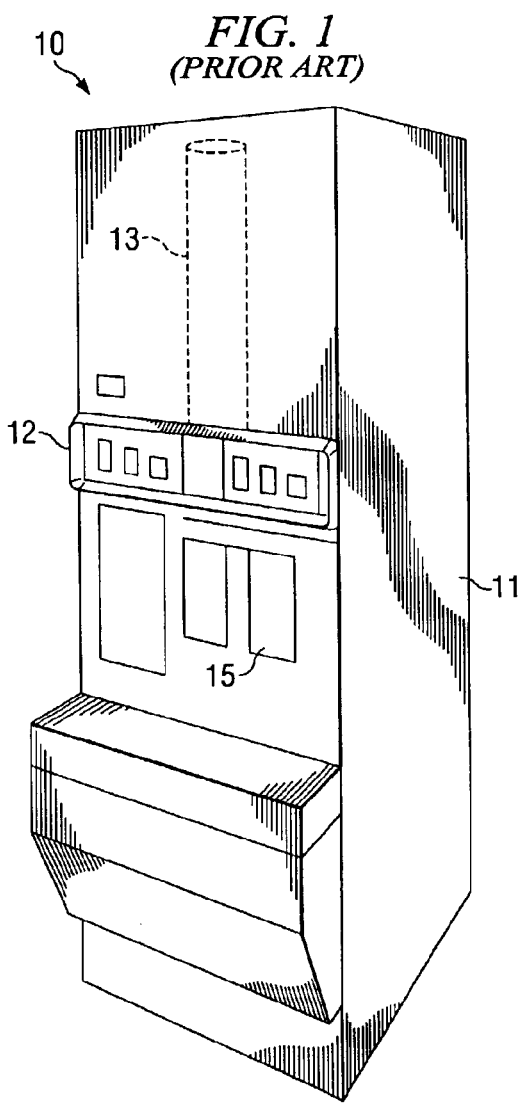
FIG. 1 is a schematic of a vertical furnace for semiconductor wafer processing. (Prior art)
Figure 3:
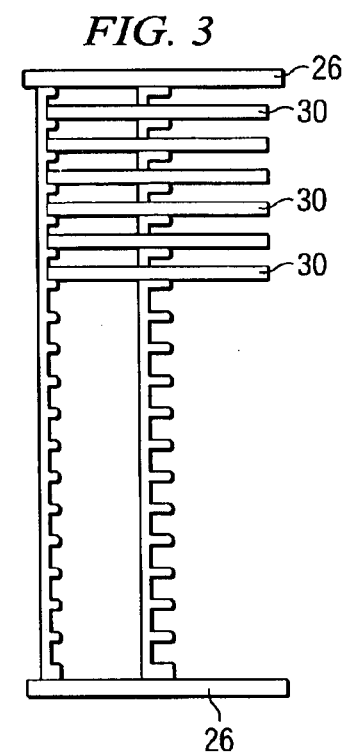
FIG. 3 is a typical boat with semiconductor wafers for furnace processing. (Prior art)
Figure 4:
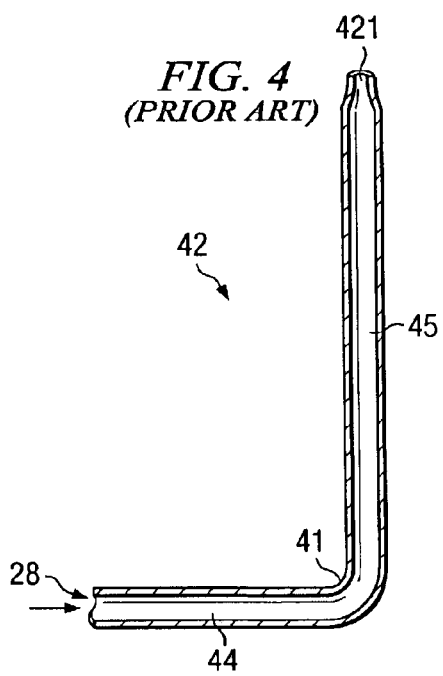
FIG. 4 is a gas injector of known art.
Figure 2:
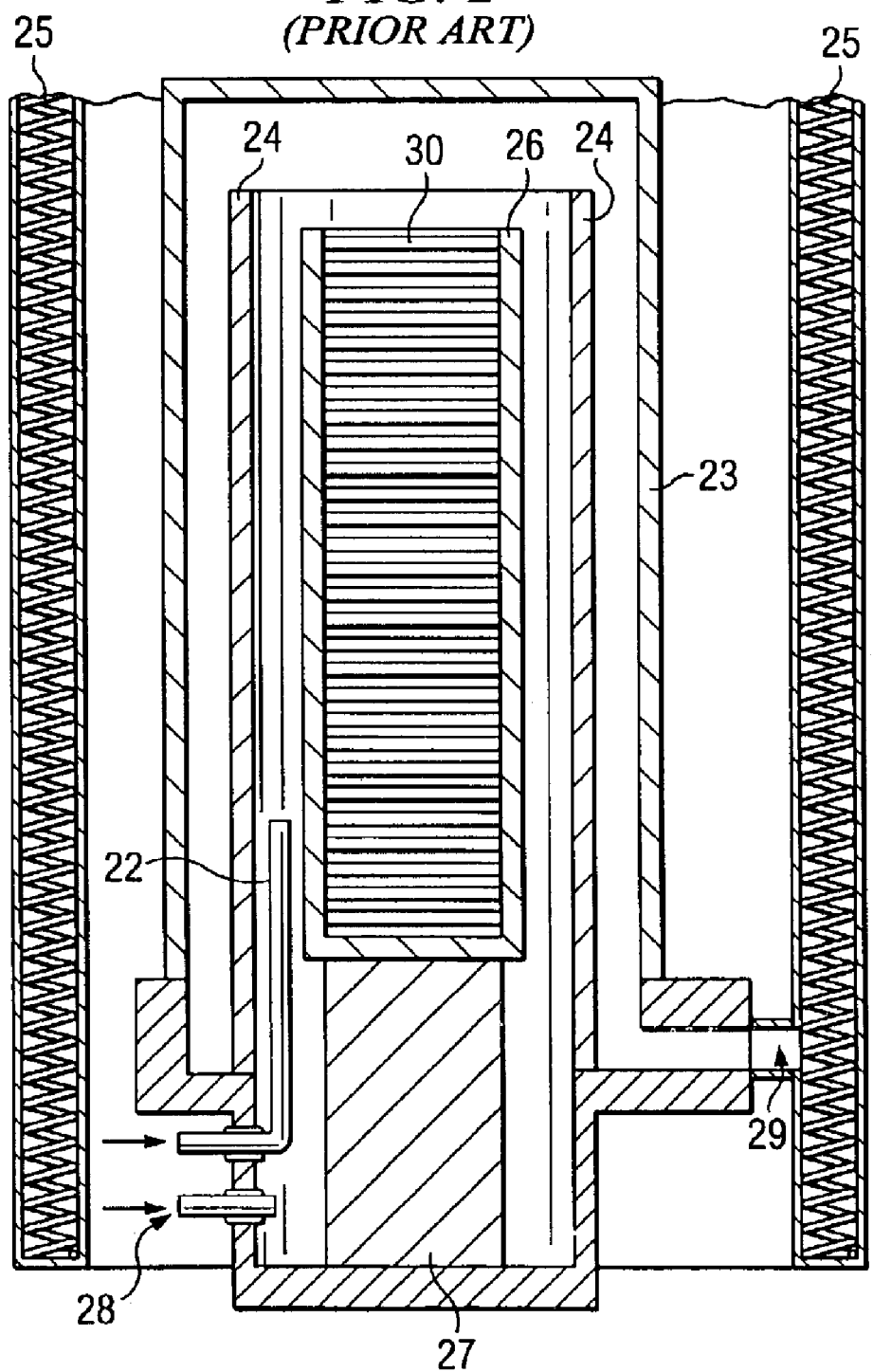
FIG. 2 is a typical furnace tube. (Prior art)

In order to better understand the problem for which this invention provides a solution, FIG. 5 illustrates a quartz furnace tube 53 having an inner liner 54, a long quartz gas injector 52, and a quartz boat 56 filled with silicon wafers 50. It can be seen that this furnace liner has smaller diameter in the upper portion 541 than that in the lower portion 542. This liner configuration having a smaller diameter near the top portion 541 slightly restricts gas flow and helps control residence time of the gas in contact with the wafers 50 in order to improve deposited film thickness uniformity.

It can further be seen that the quartz injector 52 is not consistently parallel to the liner, but as a result of thermal excursions, the injector has become distorted near the inflection point 543 of the liner, and the injector has pivoted away from the liner. At this point, the injector may come into contact with the liner during thermal excursions, and abrasion between the two components will contribute to particulate contamination. In an extreme case, the distorted long injector tip may come into contact with the boat and/or wafers, as illustrated at point 523 causing substantial damage to the furnace and costly wafers.

In an exemplary deposition process for CVD polysilicon, the liner comprises silicon carbide (SiC) having a coefficient of thermal expansion (CTE) of 4.8×10⁻6 in/in/C. A polysilicon layer having a CTE of 3.8×10–6 in/in/C is deposited onto silicon substrates at approximately 600 deg. C. The near match in CTE supports deposition of the film to be in the desirable state of compression.

In order to better explain the issues in this exemplary process, the approximate furnace dimensions are given. The furnace tube 53 is about 1400 mm in height, the liner 54 about 1000 mm, and the long injectors 52 varying between 600 and 1300 mm. The injectors are about 2 mm thick, and have an outside diameter of about 8 mm while the liner is about 3 to 4 mm thick, 375 mm in diameter at the upper portion, and about 385 mm in diameter near the base. The furnace tube 53 is about 100 mm larger in diameter than the liner.

FIG. 6 illustrates in greater detail the point where distortion of the gas injector is initiated. At point 69 where the diameter of the highly thermally conductive SiC liner 64 has narrowed, the relatively more thermally expansive liner comes into close proximity, or contact with injector 62. As the injector is contacted, it may pivot slightly, allowing it to be misaligned in the direction of the boat and wafers. In the simplest of cases, any contact during thermal excursions abrades the surfaces, and results in particulate contamination of the wafers. The contamination increases with each thermal excursion.

Injectors 62 are inserted into the furnace assembly with the vertical portion aligned parallel with the inner surface of the most narrow portion the liner 64, but with thermal excursions, spacing between the unsupported injector tube and the liner may change. In particular, distortion of long injectors becomes more pronounced as a result of the thermal expansion mismatch between liner and injector, and with increasing thermal excursions.

A solution to the problem of distortion of the long injectors and liner contact is provided by the injector design and construction of this invention. In FIG. 7, the improved injector 72 includes a standoff 75 attached to the quartz injector near the onset of vertical rise. The standoff of the same material composition as the injector, preferably quartz, is fused or otherwise permanently joined to the injector during fabrication.

Standoff 75 has precisely defined thickness which allows contact and alignment of the injector to be made near the base of the liner, and again at the tip of the injector. Standoff thickness defines the separation distance between the injector tip and upper portion of the liner directly opposite the tip.

In a preferred embodiment, taking into consideration the exemplary furnace tube design and dimensions in FIG. 5, standoff 75 comprises a rectangular quartz body of 5.5 mm thickness, and approximately 40 mm length, positioned about 15 to 30 mm above horizontal stem 74 of injector 72. Width of the standoff is 4 mm, or about half the width of cylindrical injector 72 co which it is attached. The appreciable length of the standoff, in the range of 25 to 60 mm, adds significant stability to the assembly. The required thickness of the standoff is a function of the liner design, and the desired amount of space between injector tip and the liner.

Standoff 75 is positioned in contact with the lower portion 742 of the liner, and in turn, the top of the injector 72 is positioned 1 mm from the more narrow, upper portion 741 of the liner, as diagrammed in FIG. 7. A top view of the assembly (FIG. 8A) shows injector standoff 851 in contact with the inner wall of the wider section 842 of the liner, and the injector tip spaced a fixed distance 86 from the more narrow 841 liner section. In the preferred embodiment, the space 86 or separation distance is 1 mm.

In the exemplary furnace assemblage, addition of a stabilizing standoff and a fixed space of 1 mm between the tip and liner has been shown to minimize distortion of the injector tube, and has resulted in a decrease in particulate contamination of 60% from that with previous injectors having no standoff. The significant improvement is attributed to eliminating abrasion at the inflection point of the liner. Coefficient of thermal expansion of the quartz injector and standoff is about 0.5×10−6 in/in/C, whereas that of the silicon carbide is about 4.8×10−6 in/in/C, and this difference has contributed to abrasion during thermal excursions. During processing, a large number of silicon wafers, at or near room temperature is inserted into the heated furnace reactor, causing the liner walls to cool and contract significantly. Quartz injectors having lower CTE, and thermal conductivity are relatively stable, by comparison.

In the improved injector, standoff contact is made to the liner near the base of the reactor where the furnace is cooler and below the position of wafers, and as a result has both a shorter distance for movement and a smaller temperature change to minimize thermal expansion, abrasion, and particulate contamination resulting from contact between injector and liner.

Robust contact between the liner and standoff, and the effect of substantial standoff length stabilize the injector. Precise spacing between the injector tip and liner contribute to significant particulate reduction. As a result of robust contact between liner and standoff in the lower portion of the furnace, the improved injector minimizes distortion so that it does not come into contact with the liner near the central portion of the furnace where the wafers are vulnerable to contamination, but instead has only the more rigid contact near the base where expansion and any potential abrasion are minimized.

FIG. 8B provides a diagram and formula for calculating standoff thickness requirements for a furnace having a narrow diameter at the upper portion (d2) and a larger diameter (d1) at the lower portions of the liner. Thickness (t) of the injector standoff is equal to the difference in inner liner diameters, divided by 2, plus the desired separation distance (d3) between injector tip and the inside of the liner. Alternately, the calculation is the difference in radius of the portion of the liner immediately opposite the injector tip and that where the standoff is in contact with liner, minus the specified distance between injector tip and liner.

For a furnace assembly having a straight walled liner, the standoff thickness is defined by the specified separation distance between injector tip and inner surface of the liner.

A required separation distance between liner and injector for any application is related to the expansion coefficients of the materials, length of the injector, and the range of thermal excursions.

A specific exemplary furnace and process have been provided as a preferred embodiment of the improved injector construction. However, it should be recognized that the standoff providing a fixed distance between the liner and injector tube and is therefore applicable to any injector and furnace design, as well as to alternate material combinations. A substantially long standoff of calculated thickness to define the required separation distance provides the means for elimination of a source of particulate contamination and minimizes distortion of the injector. It can further be noted that addition of a standoff adds little to the cost of the injector, and contributes to ease of installation and alignment.

What is claimed is:

1. A furnace assembly for processing semiconductor wafers including the following;

a furnace tube, a liner positioned inside said furnace tube, and one or more gas injectors having a horizontal stem and a vertical portion terminating in a tip, and a standoff of for at least one of said injections, said standoff being of specified thickness and located between said liner and the vertical portion of said at least one gas injector to control separation distance between said at least one injector and said liner.

2. An assembly as in claim 1 wherein said injectors and standoff comprise quartz.

3. An assembly as in claim 1 wherein the vertical portion of said injector are positioned inside said liner.

4. An assembly as in claim 1 wherein the thickness of said standoff is equal to a specified separation distance between the injector tip of said at least one injector, and the inner surface of said liner.

5. An assembly as in claim 1 wherein said standoff is positioned in contact with the lower portion of the liner.

6. An assembly as in claim 1 wherein the thickness of the standoff is equal to a specified separation distance between the tip of the at least one injector and the inner surface of said liner, plus any decrease in radius of the liner between the contact point of the standoff, and a point immediately opposite the injector tip.

7. An assembly as in claim 6 wherein the liner has different diameters, and the diameter is smaller at a point opposite the tip of the at least one injector, than at the lower portion of said liner where contact is made by the standoff.

8. An assembly as in claim 1 wherein said standoff is attached to the vertical portion of the at least one injector approximately 15 to 30 mm above the horizontal stem.

9. An assembly as in claim 1 wherein the length of said standoff is in the range of 25 to 60 mm.

10. An assembly as in claim 1 wherein the diameter of said standoff is approximately half the diameter of the at least one injector.

11. An assembly as in claim 1 wherein dual alignment of said at least one injector to said liner is made (1) by contact near a base of the liner and (2) by a specified separation space between injector tip and liner.

12. An assembly as in claim 1 wherein contact between the standoff and liner is made in a relatively cool portion of the furnace near a base of the liner.

13. An assembly as in claim 1 wherein the liner comprises a different material than the injectors and standoff.

14. An assembly as in claim 1 wherein the liner comprises the same material as the injectors and standoff.

15. An assembly as in claim 1 wherein contact between liner and the at least one injector is eliminated in the central portion of the furnace where wafers are present.

16. An assembly as in claim 1 wherein said standoff is fabricated as a part of said at least one injector.

* * * * *